United States Patent [19]

Martin et al.

[11] Patent Number: 4,977,380

[45] Date of Patent: Dec. 11, 1990

[54] ELECTRONICALLY TUNED ELECTRO-ACOUSTIC POWER OSCILLATOR

[75] Inventors: Robert J. Martin, Orlando; Barry L. Lane, Longwood, both of Fla.

[73] Assignee: Actran Systems, Inc., Orlando, Fla.

[21] Appl. No.: 279,043

[22] Filed: Dec. 2, 1988

[51] Int. Cl.⁵ .......................... H03B 5/12; H03J 5/22; H04B 11/00
[52] U.S. Cl. ........................................ 331/74; 331/78; 331/117 R; 331/167; 331/179
[58] Field of Search ........ 331/74, 78, 117 R, 117 FE, 331/167, 179

[56] References Cited

U.S. PATENT DOCUMENTS

| | | | |
|---|---|---|---|
| 3,100,886 | 8/1963 | Marks | 331/116 R X |
| 3,721,949 | 3/1973 | Hubbard et al. | 367/1 |
| 3,988,701 | 10/1976 | Funston | 331/179 |
| 4,306,301 | 12/1981 | Geren et al. | 367/1 |

*Primary Examiner*—Siegfried H. Grimm
*Attorney, Agent, or Firm*—Arnold, White & Durkee

[57] ABSTRACT

The electronically tuned power oscillator (ETPO) of the present invention provides a method and apparatus that drives a narrow-band (high Q) transducer over a relatively broad band of frequencies. A pseudo-random sequence generator dynamically switches a bank of capacitors varying the resonant frequency of the power oscillator. A node on the power oscillator provides the clock for the pseudo-random sequence generator thereby providing a synchronized frequency change on every time varying cycle.

4 Claims, 4 Drawing Sheets

ELECTRONICALLY TUNED ELECTRO-ACOUSTIC POWER OSCILLATOR

BACKGROUND AND SUMMARY OF THE INVENTION

This invention relates to systems and methods of tuning a narrow-band (high Q) element or device over a relatively wide band of frequencies. More particularly, this invention relates to a series tuned power oscillator for driving a piezoelectric transducer element in which the resonant frequency of oscillation may be changed on every alteration of the sinusoidal output.

A power factor corrected piezoelectric acoustic transducer system is inherently narrow-band. The circuitry of the driving amplifier forms a tuned circuit with the transducer. The transducer and tuning elements provide a resonant frequency in the middle of the acoustic range of interest. At this resonant frequency, the output circuitry transfers the maximum power to the real part of the transducer load to be radiated as acoustic energy. At frequencies other than the resonant frequency, efficiency is compromised because more energy is stored in inductors and capacitors rather than being applied to the real part of the transducer load.

Thus, frequencies at or near resonance are the frequencies of greatest efficiency. Static tuning in known devices is acceptable when an application needs only a single frequency of transmission. Unfortunately, it is often necessary to transmit a wide frequency range of signals with a single transducer. In this case, the system is tuned to the center of the band of interest and the power amplifier output is varied to maintain relatively constant acoustic (real) output as the distance (in terms of frequency) from the resonant frequency increases. Since the power factor correction system has a narrow band, the system becomes extremely inefficient when operating at frequencies other than resonance. This inefficiency results in large power losses as the required bandwidth increases. Because of this problem, known systems have been designed with a large number of tuned transducers so that each transducer covers only a narrow range of frequencies while maintaining reasonable efficiency.

The present invention advantageously provides a relatively broad band of operating frequencies for a single transducer while maintaining reasonable efficiency.

SUMMARY OF THE INVENTION

A transducer may be modeled as a series combination of a capacitor and a resistor. A transducer may be adjusted to series resonance with the addition of an inductor. The present invention adds a switched capacitor bank to the transducer/inductor combination thereby providing a circuit in which the resonant frequency may be dynamically varied over a relatively broad band of frequencies.

BRIEF DESCRIPTION OF THE DRAWINGS

The above-noted and other aspects of the present invention will become more apparent from a description of the preferred embodiment when read in conjunction with the accompanying drawings.

The drawings illustrate a preferred embodiment of the invention, wherein like members bear like reference numerals and wherein.

DESCRIPTION OF THE PREFERRED EMBODIMENT

Figure 1:
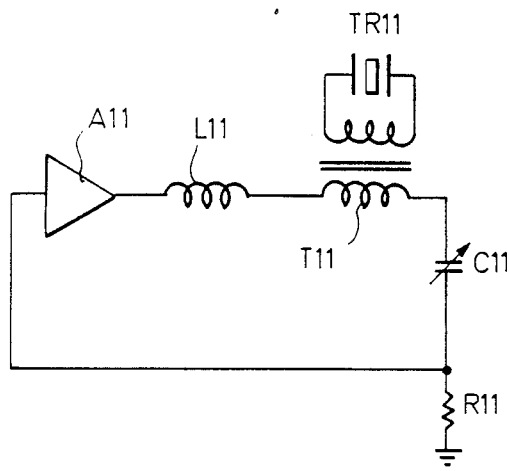
FIG. 1 is a schematic circuit diagram of a series LC embodiment of the present invention.

FIG. 1 depicts a series LC embodiment of the present invention. The oscillator shown in FIG. 1 comprises a power amplifier $A_{11}$ that drives a series combination of an inductor $L_{11}$, a transformer $T_{11}$ and a variable capacitor $C_{11}$. The circuit to ground is completed through a resistor $R_{11}$. The transformer $T_{11}$ provides power to a narrow-band element or device, shown in FIG. 1 as a transducer $TR_{11}$. By varying the capacitance of the capacitor $C_{11}$, as explained more fully below with regard to FIGS. 4, 5A and 5B, the resonant frequency of the oscillator is varied to derive a relatively broad-band response from the narrow-band transducer $TR_{11}$.

Figure 2:
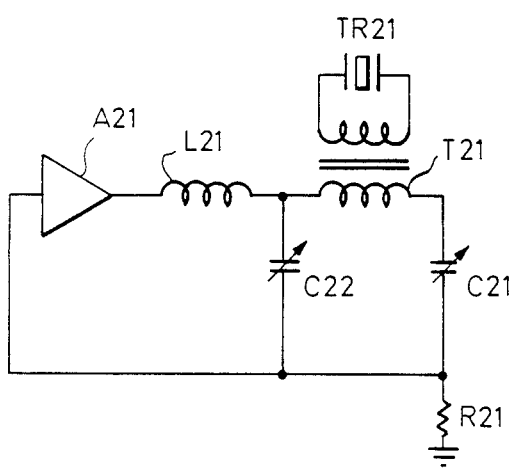
FIG. 2 is a schematic circuit diagram of a $\pi$-configured embodiment of the present invention.

FIG. 2 depicts another embodiment of the present invention, in this case a $\pi$-configured LC circuit. The oscillator shown in FIG. 2 comprises a power oscillator $A_{21}$ that drives the series combination of an inductor $L_{21}$ and a $\pi$-network of a pair of variable capacitors $C_{21}$ and $C_{22}$ and a transformer $T_{21}$. A resistor $R_{21}$ completes the circuit to ground. The transformer $T_{21}$ provides power to a narrow-band element or device, shown in FIG. 2 as a transducer $TR_{21}$. As with the series LC oscillator of FIG. 1, the varying capacitance values of capacitors $C_{21}$ and $C_{22}$ vary the resonant frequency of the circuit to derive a relatively broad-band response from the narrow-band transducer $TR_{21}$.

Figure 3:
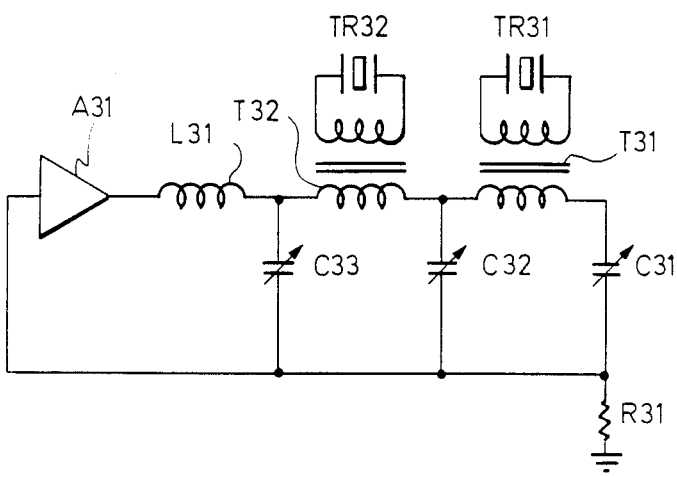
FIG. 3 is a schematic circuit diagram of a $\pi$-ladder configured embodiment.

The oscillator depicted in FIG. 3 combines the $\pi$-configured network of the oscillator of FIG. 2 with a ganged $\pi$-configured network to form a $\pi$-ladder oscillator. In other respects, the various circuit elements function in the same way as the series LC and the $\pi$-configured LC circuits.

Figure 4:
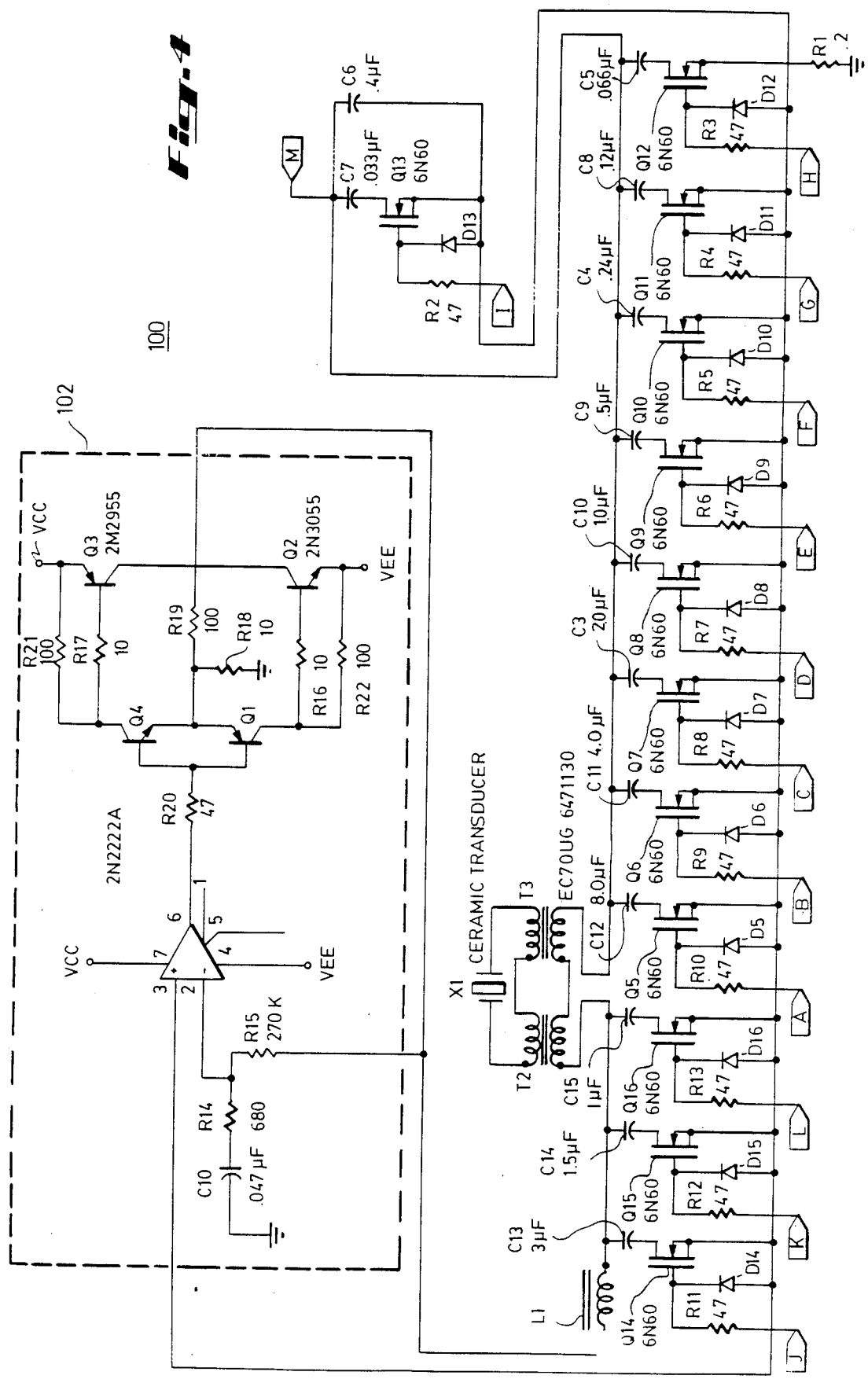
FIG. 4 is a schematic circuit diagram of a specific example of the $\pi$-configured embodiment of the present invention.

FIG. 4 depicts a preferred embodiment of an electronically tuned power oscillator (ETPO) 100 of the present invention. The component values are merely illustrative. A power amplifier 102 provides power in the conventional manner to drive the ETPO 100. An inductor $L_1$ provides the inductance component of the oscillator resonance impedance. A pair of transformers $T_2$ and $T_3$ drive a ceramic transducer $X_1$. The resonant frequency of the ETPO 100 is varied by coupling and de-coupling a switched bank of capacitors $C_3$ through $C_{15}$. Since capacitors coupled in parallel provide a capacitance that is the sum of the individual capacitances, coupling and de-coupling the capacitors $C_3$ through $C_{15}$ develops a time varying capacitance.

Switching a set of switches $Q_5$ through $Q_{16}$ accomplishes the coupling and de-coupling of the capacitors $C_3$ through $C_{15}$. For example, with $Q_5$ conducting, capacitor $C_{12}$ contributes its capacitance to the sum of capacitances. A set of input terminals A through L provide the control for the switches $Q_5$ through $Q_{16}$. For example, if the voltage on the input terminal A goes high (a logical "1"), the switch $Q_5$ turns on (closes) and the capacitor $C_{12}$ is coupled into the circuit. If the voltage on the input terminal A goes low (a logical "0"), the switch $Q_5$ turns off (opens) and the capacitor $C_{12}$ is de-coupled from the circuit. If all of the switches $Q_5$ through $Q_{16}$ are open, a capacitor $C_6$ provides a minimum capacitance to a series LC configuration like that of FIG. 1.

A resistor $R_1$ completes the circuit to ground. An output terminal M provides a clock signal for the pseudo-random sequence generator of FIG. 5.

Figure 5A:
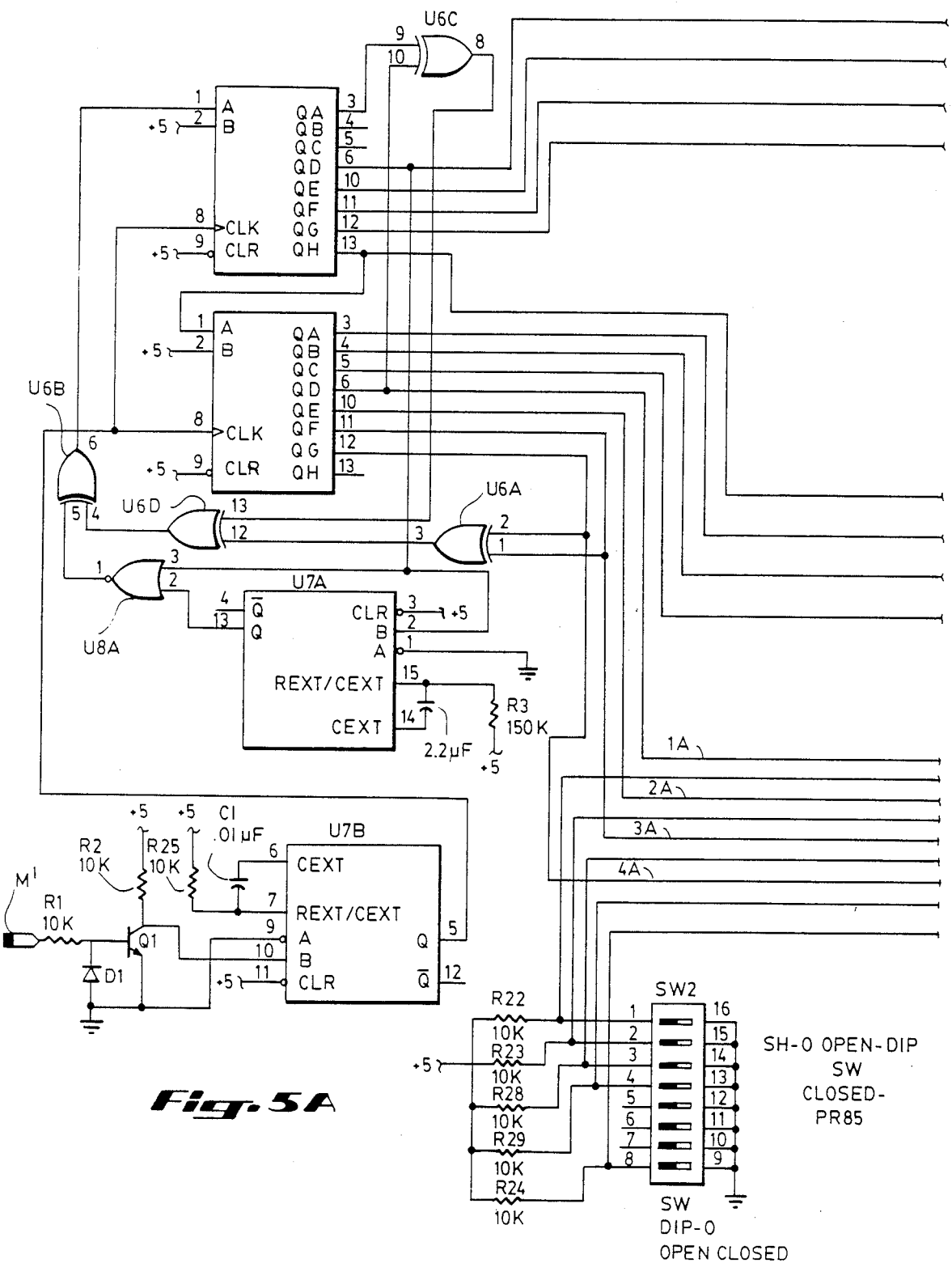
FIGS. 5A and 5B together are a schematic circuit diagram of pseudo-random sequence generator used to dynamically switch the resonant frequency of an oscillator in accordance with the present invention.
Figure 5B:
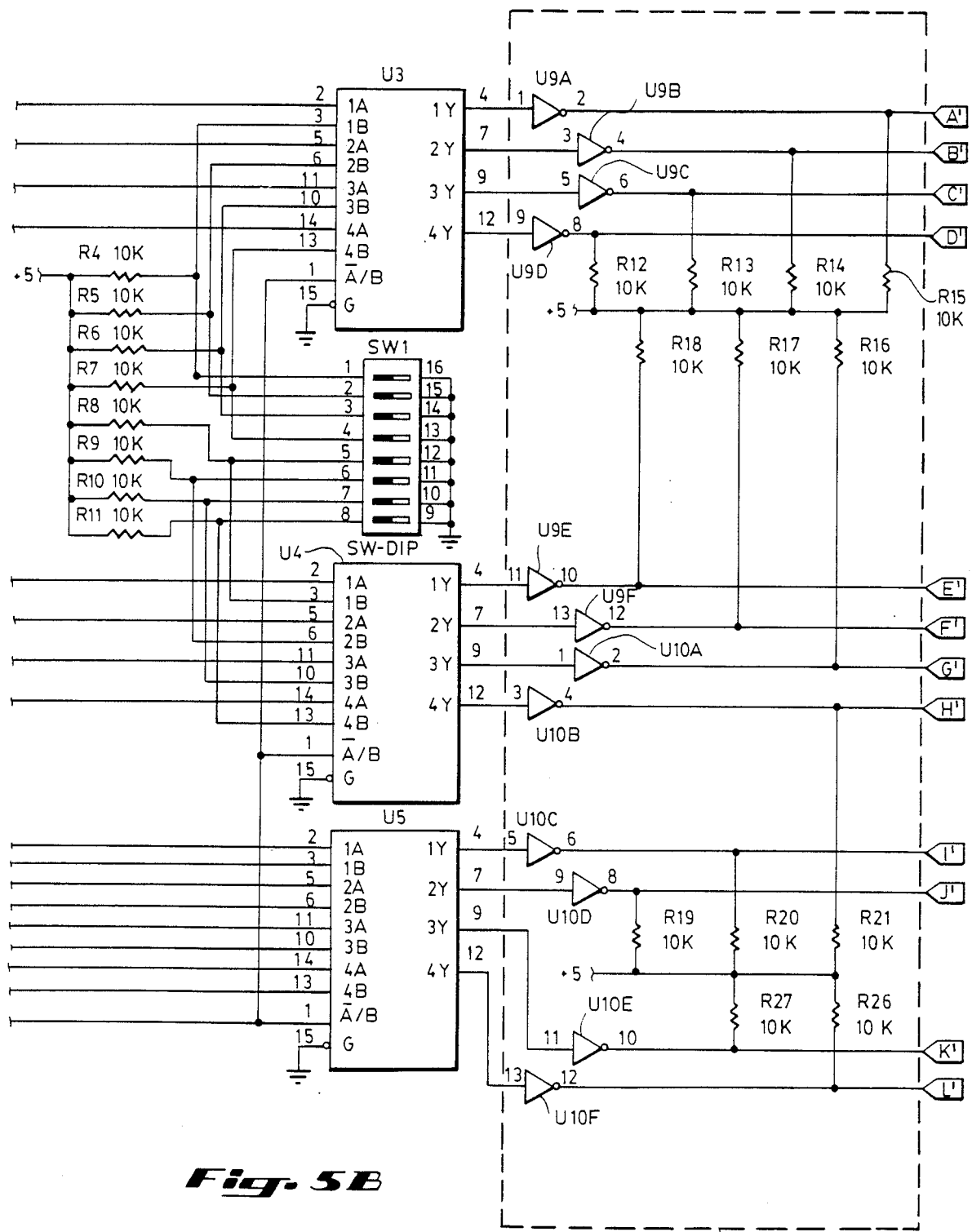

FIGS. 5A and 5B together depict a preferred embodiment of a pseudo-random binary sequence (PRBS) generator 200.

A one-shot monostable multivibrator U7B is triggered by input M', which comes from the electronically tuned power oscillator output terminal M. Thus, the digital electronics of the PRBS generator 200 is driven by a clock from the ETPO; the one-shot monostable multivibrator U7B brings this clock signal into compatible voltage limits and synchronizes this clock signal with the sequence generator 200. In a preferred embodiment, multivibrator U7B is a 74LS123.

The Q output of the multivibrator U7B feeds the clock inputs of a set of shift registers U1 and U2; in a preferred embodiment, each of U1 and U2 is a 74LS164. The QH output of U1 feeds the A input of shift register U2 to form one longer (U1/U2) shift register in a manner known in the art. The output QA of U1 is the least significant bit (LSB) of the U1/U2 shift register and the output QH of U2 is the most significant bit (MSB) (not used in this illustrative embodiment).

The PRBS generator is a polynomial generator, where the particular sequence generated is based on the feedback of the taps on the U1/U2 shift register.

A set of XOR gates U6A, U6B, U6C, and U6D are effectively binary feedback paths around the shift register. The selection of taps on the U1/U2 shift register provides the particular pseudo-random pattern that is generated. There is a variety of maximal length pseudo-random patterns depending on the particular taps that are selected. In this illustrative embodiment, virtually any maximal length sequence is acceptable and the length of the pseudo-random sequence can be changed as a $2^N-1$ sequence length where N is the length of the shift register. In the illustrative embodiment, a $2^{16}-1$ maximum sequence length is provided. Since the MSB used is taken from the output QG of U2, a $2^{15}-1$ sequence length is actually used.

Uncertainty exists at the outputs of the U1/U2 shift register on initial power-up. The system may power-up in a static condition (e.g., all "0's"). This can cause the system to lock-up. This condition is prevented by a one-shot monostable multivibrator U7A, in a preferred embodiment, a 74LS123. If on power-up the system comes up in a static condition, that is, the shift register U1/U2 is simply shifting zeros around the system, U7A forces the system out of that condition. Upon power-up, after U7A forces the U1/U2 shift register to sequence the selected polynomial, it serves no function in subsequent circuit operation. The output Q of U7A feeds one input of a NOR gate U8A. The output of U8A feeds one input of the XOR gate U6B, thereby entering the pseudo-random sequence loop.

In the illustrative embodiment, the XOR gate U6C is fed by outputs QA of U1 and QD of U2; XOR gate U6A is fed by outputs QF and QG of U2; XOR gate U6D is fed by the outputs of XOR gates U6A and U6C; and XOR gate U6B is fed by the outputs of XOR gate U6D and NOR gate U8A. The selection of which outputs of U1 and U2 to input to U6A and U6C sets the selected polynomial.

A set of two-to-one multiplexers U3, U4, and U5 drive an analog section 202. These multiplexers allow either the selection of the pseudo-random pattern or a static pattern set by a pair of Dip switches SW1 and SW2. Thus, the sequence generator 200 may be driven in a selected pseudo-random mode or in a fixed, "tonal" mode at a constant, single frequency. The selection of mode is controlled by a Switch 8 on SW2. If the switch 8 on SW2 is in the Open position, Dip switches SW1 and SW2 set the FET switches $Q_5$ through $Q_{16}$ of FIG. 4. These switches are set by the analog section 202 of the sequence generator 200. If the switch 8 is in the Closed position, then the pseudo-random binary sequency is applied to the analog electronics.

The analog section 202 comprises a set of drivers U9A through U9F and U10A through U10F as well as an array of resistors R12 through $R_{21}$ and R26 and R27. The open-collector inverter buffer-drivers U9A through U9F and U10A through U10F drive the FET switching elements of the ETPO.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. An oscillator comprising:
   an amplifier;
   an inductor in series with the amplifier;
   a pi configured tuning circuit comprising two banks of switched capacitors with a transformer therebetween, said tuning circuit being in series with the inductor;
   a transducer element driven by said transformer; and
   a resistor in series with the tuning circuit.

2. The oscillator of claim 1 where at least one capacitor in the banks of switched capacitors is selectively switched by an associated field effect transistor.

3. A method of energizing a narrow-band transducer over a broad band of frequencies, comprising the steps of:
   a. exciting the transducer with a power source tuned to a resonant frequency; and
   b. varying the resonant frequency by coupling and decoupling a plurality of parallel capacitors, said parallel capacitors being connected in series with the power source and wherein the coupling and de-coupling of the parallel capacitors is performed dynamically with field effect transistors, wherein the field effect transistors are opened and closed in response to a signal from a pseudo-random sequence generator.

4. A power oscillator comprising a series combination of an amplifier, and inductor, a transformer, an electronically tuned capacitor whose capacitance is varied in a pseudo-random pattern, and a resistor, wherein said transformer drives a transducer.

* * * * *